United States Patent
Zhang

(10) Patent No.: US 11,746,287 B2
(45) Date of Patent: Sep. 5, 2023

(54) QUANTUM DOT LIGHT EMITTING DIODE, MANUFACTURING METHOD THEREOF, AND DISPLAY DEVICE

(71) Applicants: Beijing BOE Technology Development Co., Ltd., Beijing (CN); BOE TECHNOLOGY GROUP CO., LTD., Beijing (CN)

(72) Inventor: Aidi Zhang, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 168 days.

(21) Appl. No.: 17/214,114

(22) Filed: Mar. 26, 2021

(65) Prior Publication Data
US 2022/0064523 A1    Mar. 3, 2022

(30) Foreign Application Priority Data

Aug. 25, 2020   (CN) .......................... 202010862979.9

(51) Int. Cl.
| | |
|---|---|
| *C09K 11/06* | (2006.01) |
| *C09K 11/54* | (2006.01) |
| *H10K 85/10* | (2023.01) |
| *B82Y 20/00* | (2011.01) |
| *B82Y 30/00* | (2011.01) |
| *B82Y 40/00* | (2011.01) |
| *H10K 50/15* | (2023.01) |

(Continued)

(52) U.S. Cl.
CPC .............. *C09K 11/06* (2013.01); *C09K 11/54* (2013.01); *H10K 85/10* (2023.02); *B82Y 20/00* (2013.01); *B82Y 30/00* (2013.01); *B82Y 40/00* (2013.01); *C09K 2211/10* (2013.01); *H10K 50/15* (2023.02); *H10K 50/16* (2023.02); *H10K 50/18* (2023.02)

(58) Field of Classification Search
CPC . H01L 51/502; H01L 51/5096; H10K 50/115; H10K 50/18; H10K 50/167; H10K 50/16
See application file for complete search history.

(56) References Cited

U.S. PATENT DOCUMENTS

2017/0358757 A1\* 12/2017 Lee .................. C09K 11/02
2018/0138434 A1\*  5/2018 Yoon ................ H01L 29/6609
2019/0305241 A1\* 10/2019 Angioni .............. H01L 51/56
(Continued)

*Primary Examiner* — Alia Sabur
(74) *Attorney, Agent, or Firm* — HOUTTEMAN LAW LLC

(57) ABSTRACT

The present disclosure provides a quantum dot light emitting diode, a manufacturing method thereof and a display device, and belongs to the field of display technologies. The quantum dot light emitting diode of the present disclosure includes an anode layer, a cathode layer, a quantum dot layer disposed between the anode layer and the cathode layer, an electron transport layer disposed between the quantum dot layer and the cathode layer, and an electron blocking layer disposed between the electron transport layer and the quantum dot layer; and metal-sulfur bonds are formed in an interface between the electron blocking layer and the quantum dot layer, and contain metal elements from the quantum dot layer and sulfur elements from the electron blocking layer.

20 Claims, 3 Drawing Sheets

(51) Int. Cl.
*H10K 50/16* (2023.01)
*H10K 50/18* (2023.01)

(56) References Cited

U.S. PATENT DOCUMENTS

2022/0310954 A1* 9/2022 Zhang .................. C07C 211/54
2022/0328776 A1* 10/2022 Li .......................... H01L 51/56

* cited by examiner

QUANTUM DOT LIGHT EMITTING DIODE, MANUFACTURING METHOD THEREOF, AND DISPLAY DEVICE

CROSS REFERENCE TO RELATED APPLICATION

The present disclosure claims the priority of Chinese Patent Application No. 202010862979.9 filed on Aug. 25, 2020, the entire contents of which are incorporated herein by reference.

TECHNICAL FIELD

The present disclosure belongs to the field of display technologies, and particularly relates to a quantum dot light emitting diode, a manufacturing method thereof and a display device.

BACKGROUND

A Quantum Dot Light Emitting Diode (QLED) typically includes a light emitting layer, which has a plurality of quantum dot nanocrystals, and is sandwiched between an electron transport layer and a hole transport layer. By applying an electric field to the quantum dot light emitting diode, electrons and holes can be transported into the light emitting layer. In the light emitting layer, the electrons and the holes are trapped in quantum dots and recombined, thereby emitting photons. Compared with an organic light emitting diode, the quantum dot light emitting diode has a narrower emission spectrum.

SUMMARY

An embodiment of the present disclosure provides a quantum dot light emitting diode, which includes an anode layer, a cathode layer, a quantum dot layer disposed between the anode layer and the cathode layer, and an electron transport layer disposed between the quantum dot layer and the cathode layer, and further includes an electron blocking layer disposed between the electron transport layer and the quantum dot layer, metal-sulfur bonds are formed in an interface between the electron blocking layer and the quantum dot layer, and the metal sulfur bonds contain metal elements from the quantum dot layer and sulfur elements from the electron blocking layer.

In some implementations, the electron blocking layer is made of a sulfhydryl-containing siloxane polymer.

In some implementations, the sulfhydryl-containing siloxane polymer includes any one of 3-mercaptopropyltrimethoxysilane, 3-mercaptopropyltriethoxysilane, 3-mercaptopropylmethyldimethoxysilane, 3-mercaptopropylmethyldiethoxysilane, mercaptopropylsilane, 3-mercaptopropyltrimethylsilane, and bis-[3-(triethoxysilyl)propyl]-tetrasulfide.

In some implementations, an alkyl group in the sulfhydryl-containing siloxane polymer includes any one of methyl, ethyl, propyl, hexyl, nonyl, dodecyl, tetradecyl, hexadecyl, octadecyl, and phenyl.

In some implementations, a material of the quantum dot layer includes organic-inorganic hybrid perovskite quantum dots or all-inorganic perovskite quantum dots.

In some implementations, the organic-inorganic hybrid perovskite quantum dots are MABX, MA is $CH_3NH_3$, B is any one of Pb, Sn, Sb and Ag, and X is any one of Cl, Br and I; and the all-inorganic perovskite quantum dots are ABX, A is Cs, B is any one of Pb, Sn, Sb and Ag, and X is any one of Cl, Br and I.

In some implementations, a material of the electron transport layer includes at least one of zinc oxide, magnesium zinc oxide, aluminum zinc oxide, and magnesium aluminum zinc oxide, or includes at least one of ion-doped zinc oxide, ion-doped magnesium zinc oxide, ion-doped aluminum zinc oxide, and ion-doped magnesium aluminum zinc oxide.

In some implementations, the quantum dot light emitting diode further includes a substrate, a hole transport layer, and a hole injection layer, and the cathode layer, the electron transport layer, the electron blocking layer, the quantum dot layer, the hole transport layer, the hole injection layer, and the anode layer are sequentially disposed in a direction away from the substrate.

In some implementations, the electron blocking layer has a thickness of about 0.685 nm.

In some implementations, the quantum dot light emitting diode further includes a hole transport layer disposed between the anode layer and the quantum dot layer, and a hole injection layer disposed between the hole transport layer and the anode layer.

An embodiment of the present disclosure further provides a manufacturing method of a quantum dot light emitting diode, which includes steps of forming an anode layer, a cathode layer, a quantum dot layer between the anode layer and the cathode layer, and an electron transport layer between the quantum dot layer and the cathode layer, and further includes:

a step of forming an electron blocking layer between the electron transport layer and the quantum dot layer, with metal-sulfur bonds formed in an interface between the electron blocking layer and the quantum dot layer, and the metal-sulfur bonds containing metal elements from the quantum dot layer and sulfur elements from the electron blocking layer.

In some implementations, the electron blocking layer is made of a sulfhydryl-containing siloxane polymer, and the step of forming the electron blocking layer includes:

dissolving a sulfhydryl-containing silane reagent in a nonpolar solution, and dripping the nonpolar solution of the sulfhydryl-containing silane reagent to a side of the electron transport layer away from the cathode layer, so as to form the electron blocking layer; or, immersing the substrate formed with the electron transport layer thereon in a nonpolar solution of a sulfhydryl-containing silane reagent, so as to form the electron blocking layer.

In some implementations, the sulfhydryl-containing siloxane polymer includes any one of 3-mercaptopropyltrimethoxysilane, 3-mercaptopropyltriethoxysilane, 3-mercaptopropylmethyldimethoxysilane, 3-mercaptopropylmethyldiethoxysilane, mercaptopropylsilane, 3-mercaptopropyltrimethylsilane, and bis-[3-(triethoxysilyl)propyl]-tetrasulfide.

An embodiment of the present disclosure further provides a display device, including the above quantum dot light emitting diode.

DETAILED DESCRIPTION

Figure 1:
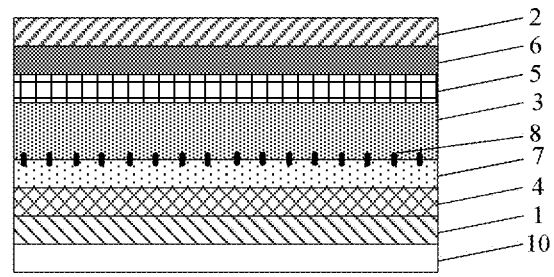
FIG. 1 is a schematic structural diagram of a quantum dot light emitting diode according to an embodiment of the present disclosure.

In order to enable those skilled in the art to better understand the technical solutions of the present application, the technical solutions of the present application are further described in detail below with reference to the accompanying drawings and specific embodiments.

Unless otherwise defined, technical terms or scientific terms used in the present disclosure should have general meanings that can be understood by people with ordinary skills in the technical field of the present disclosure. The words "one", "a", "the" and the like are not used to limit the quantity, but denote "at least one". The words "include", "comprise" and the like indicate that an element or object before the words covers the elements or objects or the equivalents thereof listed after the words, rather than excluding other elements or objects. The words "combined" or "coupled" and the like are not restricted to physical or mechanical combination or connection, but can indicate electrical or chemical combination or connection, whether direct or indirect. The words such as "on" that indicate positional relationships are only used to indicate relative positional relationships. When an absolute position of an object described is changed, the relative positional relationships may also be changed accordingly A basic structure of a light emitting device includes an anode layer, a cathode layer, and a light emitting layer between the anode layer and the cathode layer. Under an applied voltage, electrons and holes are injected from a cathode direction and an anode direction respectively, migrate and are combined in the light emitting layer to generate excitons, the energy of which is attenuated in the form of light, that is, emitting light. In the case where the light emitting device is a quantum dot light emitting diode, the light emitting layer is a quantum dot layer made of quantum dots.

Perovskite quantum dots (e.g. organic-inorganic hybrid perovskite quantum dots ($MAPbX_3$, MA represents $CH_3NH_3$), and all-inorganic perovskite quantum dots ($CsPbX_3$, X represents any one of Cl, Br and I)) are novel fluorescent materials having excellent optical properties, such as high fluorescence quantum yield (up to 90%), wide absorption spectrum (ranging from 410 nm to 690 nm), and narrow emission spectrum (having a full width at half maximum less than 30 nm). Those novel fluorescent materials have a wide application in the fields of photoelectric devices (such as solar cells) and luminescent display. In recent years, the potential application of metal halide perovskite quantum dot materials in the field of perovskite quantum dot light emitting diodes (PQLEDs) have attracted more and more attention, and the PQLEDs have been rapidly improved in device efficiency.

Light emitting devices may be upright light emitting devices or inverted light emitting devices. A light emitting device generally includes a substrate; for an upright light emitting device, the anode layer is closer to the substrate than the cathode layer, while for an inverted light emitting device, the cathode layer is closer to the substrate than the anode layer. Whether the light emitting device is an upright light emitting device or an inverted light emitting device, the light emitting device may be a top-emission type light emitting device or a bottom-emission type light emitting device. In the case where the light emitting device is an upright top-emission light emitting device, the anode layer is a reflective electrode, and the cathode layer is a transmissive electrode; in the case where the light emitting device is an upright bottom-emission light emitting device, the anode layer is a transmissive electrode, and the cathode layer is a reflective electrode; in the case where the light emitting device is an inverted top-emission light emitting device, the anode layer is a transmissive electrode, and the cathode layer is a reflective electrode; and in the case where the light emitting device is an inverted bottom-emission light emitting device, the anode layer is a reflective electrode, and the cathode layer is a transmissive electrode.

With continuous optimization of performance of light emitting devices, in addition to the anode layer, the cathode layer and the light emitting layer, the light emitting device may further include a hole injection layer (HIL) and a hole transport layer (HTL) disposed between the anode layer and the light emitting layer, and an electron transport layer (ETL) disposed between the light emitting layer and the cathode Layer. Moreover, an electron injection layer (EIL) may also be disposed between the electron transport layer and the cathode layer.

At present, in the field of QLEDs, inorganic zinc oxide has been gradually used as a material of an electron transport layer due to wide band gap, high electron mobility, and good transparency and conductivity. However, the related research found that zinc oxide also has some disadvantages when being used as the material of the electron transport layer.

Firstly, for an upright light emitting device, the preparation of the electron transport layer may cause damage to the light emitting layer. Specifically, the upright light emitting device typically includes an anode layer, a hole injection layer, a hole transport layer, a light emitting layer, an electron transport layer, and a cathode layer sequentially disposed in a direction away from a substrate. Orthogonal solvents are usually selected during the introduction of the different layers into the light emitting device. A nonpolar solvent, such as hexane, heptane, octane, toluene, and chloroform, is typically used in a film formation process of a material of the light emitting layer, while a material (e.g. including zinc oxide particles) of the electron transport layer is typically dispersed in a polar solvent such as ethanol. Since ethanol is very destructive to ionic perovskite quantum dots, the fluorescent properties of the perovskite materials can be deteriorated or eliminated, which further leads to degradation of the performance of the light emitting device. Therefore, the light emitting layer made of a perovskite material is not suitable for the upright light emitting device.

Secondly, in an inverted light emitting device, a large number of defective sites, such as hydroxyl groups (—OH) and oxygen vacancies, exist in a surface of an electron transport layer made of a zinc oxide material, which can cause rapid degradation of the light emitting device, resulting in efficiency roll-off of the light emitting device.

Thirdly, zinc oxide has a relatively high electron transport rate (ranging from 200 $cm^2V^{-1}s^{-1}$ to 300 $cm^2V^{-1}s^{-1}$). In a device structure of a QLED, since an electron transport rate is usually greater than a hole transport rate, unbalanced carrier injection occurs and leads to excessive accumulation of electrons in a light emitting layer, which affects the performance of the light emitting device. The excessive accumulation of electrons in the light emitting layer can be partially alleviated by adding an electron blocking layer, such as a polymethyl methacrylate intercalation layer or a silica thin layer, between the electron transport layer of a zinc oxide material and the quantum dot light emitting layer.

Fourthly, a zinc oxide film can easily adsorb water, which can damage surface ligands of material of a light emitting layer. In the case where the light emitting layer is made of a perovskite material, the moisture adsorption can cause serious damage because the perovskite material has an ionic structure and will be decomposed when encountering water, alcohol, and acetone, resulting in destruction of the light emitting layer. Thus, the service life of the light emitting device is shortened, and the improvement in the performance of the light emitting device is limited.

In view of the above problems, the embodiments of the present disclosure provide the following technical solutions.

FIG. 1 is a schematic structural diagram of a quantum dot light emitting diode according to an embodiment of the present disclosure. As shown in FIG. 1, the embodiment of the present disclosure provides a quantum dot light emitting diode, including an anode layer 2, a cathode layer 1, a quantum dot layer 3 disposed between the anode layer 2 and the cathode layer 1, an electron transport layer 4 disposed between the quantum dot layer 3 and the cathode layer 1, and an electron blocking layer 7 disposed between the electron transport layer 4 and the quantum dot layer 3; and metal-sulfur bonds 8 are formed in an interface between the electron blocking layer 7 and the quantum dot layer 3, and contain metal elements from the quantum dot layer 3 and sulfur elements from the electron blocking layer 7.

It should be noted that the metal-sulfur bonds 8 are merely for exemplary illustration of a fact that the quantum dot layer and the electron blocking layer are combined through chemical bonds, and is not a limitation on the morphology.

The electron blocking layer 7 is added to the quantum dot light emitting diode according to the embodiment of the present disclosure, so that the electron transport rate can be reduced to avoid the problem that the device performance is affected by the excessive accumulation of electrons in the quantum dot layer 3 caused by the unbalanced carrier injection occurring because the electron transport rate is usually greater than the hole transport rate; meanwhile, the metal-sulfur bonds 8, which contain the metal elements from the quantum dot layer 3 and the sulfur elements from the electron blocking layer 7, are formed in the interface between the electron blocking layer 7 and the quantum dot layer 3, in this way, the interface between the electron blocking layer 7 and the quantum dot layer 3 forms an organically combined body through the metal-sulfur bonds 8 to achieve close coupling between the electron transport layer 4 and the quantum dot layer 3, which prevents the electron transport layer 4 from adsorbing water and oxygen, thereby reducing the damage to the material of the quantum dot layer 3.

In some implementations, the material of the electron transport layer 4 includes at least one of zinc oxide, magnesium zinc oxide, aluminum zinc oxide, and magnesium aluminum zinc oxide; the material of the electron transport layer 4 may further include at least one of ion-doped zinc oxide, ion-doped magnesium zinc oxide, ion-doped aluminum zinc oxide, and ion-doped magnesium aluminum zinc oxide, such as magnesium oxide nanoparticles doped with Mg, In, Al and Ga.

It should be noted that the embodiment of the present disclosure is described by taking the material of the electron transport layer 4 being zinc oxide as an example, but the use of zinc oxide as the material of the electron transport layer 4 does not impose a limitation on the protection scope of the embodiment of the present disclosure.

In some implementations, the material of the electron blocking layer 7 may be a sulfhydryl (SH)-containing siloxane polymer. In some instances, the sulfhydryl-containing siloxane polymer includes, but is not limited to, any one of 3-mercaptopropyltrimethoxysilane, 3-mercaptopropyltriethoxysilane, 3-mercaptopropylmethyldimethoxysilane, 3-mercaptopropylmethyldiethoxysilane, mercaptopropylsilane, 3-mercaptopropyltrimethylsilane, and bis-[3-(triethoxysilyl)propyl]-tetrasulfide. The alkyl group in the sulfhydryl-containing siloxane polymer includes any one of methyl, ethyl, propyl, hexyl, nonyl, dodecyl, tetradecyl, hexadecyl, octadecyl, and phenyl.

In some implementations, the following materials may be used as the material of the quantum dot layer 3.

(1) Lead-containing perovskite quantum dots, such as organic-inorganic lead halide $MAPbX_3$ quantum dots, all-inorganic cesium lead halide $CsPbX_3$ quantum dots, and rare earth ion (lanthanum, samarium, uranium, etc.)-doped $MAPbX_3$ or $CsPbX_3$ quantum dots, MA being $CH_3NH_3$, and X being any one of Cl, Br and I.

(2) At least one of bismuth-based perovskite quantum dots, tin-based perovskite quantum dots, and silver-based perovskite quantum dots, such as $CsSnX_3$ quantum dots, $CsSbX_3$ quantum dots, $Cs_2SnX_6$ quantum dots, $Cs_2AgInCl_6$ quantum dots, $MASbX_3$ quantum dots, and $MASnX_3$ quantum dots, MA being $CH_3NH_3$, and X being any one of Cl, Br and I.

(3) Core-shell structured quantum dot materials, in which the core includes a material selected from the group consisting of CdS, CdSe, ZnSe, InP, CuInS, (Zn)CuInS, (Mn)CuInS, AgInS, (Zn)AgInS, CuInSe, CuInSeS, PbS, organic-inorganic perovskite materials, inorganic perovskite materials, and any combination or alloy thereof, and the shell includes a material selected from the group consisting of ZnS, ZnSeS, CdS, organic-inorganic perovskite materials, inorganic perovskite materials, and any combination or alloy thereof. For example, examples of the quantum dot materials include CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS, organic-inorganic perovskite materials, and inorganic perovskite materials. Examples of the organic-inorganic perovskite materials include $MAPbX_3$, MA represents $CH_3NH_3$ and X represents a halide. Examples of the inorganic perovskite materials include $CsSb_2Br_9$, $CsBi_2Br_9$, and $CsPbX_3$, and X represents a halide.

It should be noted that the quantum dots in the quantum dot layer 3 are hereinafter referred to as perovskite quantum dots.

In some implementations, the perovskite quantum dots in the embodiment of the present disclosure may be organic-inorganic hybrid perovskite quantum dots or all-inorganic perovskite quantum dots. The organic-inorganic hybrid perovskite quantum dots are MABX, MA is $CH_3NH_3$, B is any one of Pb, Sn, Sb and Ag, and X is any one of Cl, Br and I; and the all-inorganic perovskite quantum dots are ABX, A is Cs, B is any one of Pb, Sn, Sb and Ag, and X is any one of Cl, Br and I. That is, the metal ions in the perovskite quantum dots include, but are not limited to, $Pb^{2+}$, $Sn^{2+}$, $Sb^{2+}$, $Ag^+$, etc., that is, the metal elements in the quantum dot layer 3 are Pb, Sn, Sb, Ag, or the like.

Figure 2:
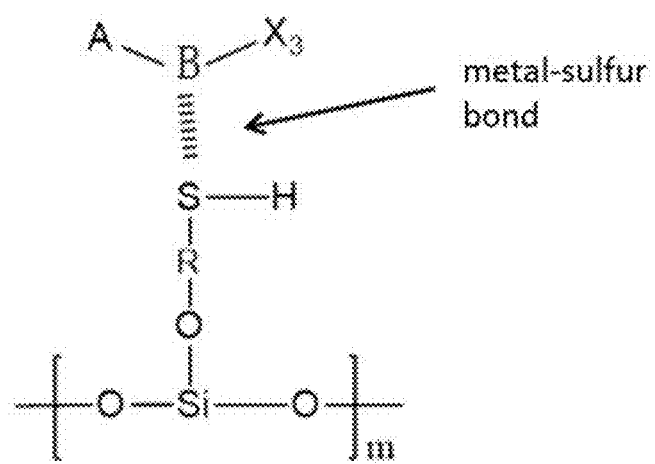
FIG. 2 is a diagram illustrating structural characteristics of a metal-sulfur bond formed by a reaction between a sulfhydryl-containing siloxane polymer and perovskite quantum dots.

Specifically, FIG. 2 is a diagram illustrating structural characteristics of a metal-sulfur bond formed by a reaction between a sulfhydryl-containing siloxane polymer and perovskite quantum dots. As shown in FIG. 2, A represents $CH_3NH_3$ or Cs, B represents any one of Pb, Sn, Sb and Ag, X represents any one of Cl, Br and I, R represents an alkyl group in the sulfhydryl-containing siloxane polymer, including any one of methyl, ethyl, propyl, hexyl, nonyl, dodecyl, tetradecyl, hexadecyl, octadecyl and phenyl, and m ranges from 100 to 100000. When the electron blocking layer 7 is made of a sulfhydryl-containing siloxane polymer, the sulfhydryl group of the siloxane polymer chemically reacts with the divalent or monovalent metal ions (such as $Pb^{2+}$, $Sn^{2+}$, $Sb^{2+}$, and $Ag^+$) in the perovskite quantum dot layer 3 to form strong metal-sulfur bonds (Pb—S bonds, Sn—S bonds, Sb—S bonds, and Ag—S bonds), and the electron transport layer 4 and the perovskite quantum dot layer 3 are closely coupled through the metal-sulfur bonds to form an organically combined body.

In the embodiment of the present disclosure, the electron blocking layer 7 is a layer of sulfhydryl-containing siloxane polymer, the electron transport layer 4 is a zinc oxide layer, the quantum dot light emitting layer 3 is a perovskite quantum dot layer, and a specific layer of sulfhydryl-containing siloxane polymer is disposed between the zinc oxide layer and the perovskite quantum dot layer. The layer of sulfhydryl-containing siloxane polymer is coupled to the zinc oxide layer through specific siloxane bonds, and is coupled to the perovskite quantum dot layer through specific metal-sulfur bonds, so as to finally form a monolayer structure (the electron blocking layer 7) having a specific thickness of about 0.685 nm (a diameter of a silicon atom is about 0.117 nm, a diameter of an oxygen atom is about 0.148 nm, a diameter of a carbon atom is about 0.17 nm, and a diameter of a sulfur atom is about 0.102 nm). That is, the thickness of the finally formed monolayer is about 0.685 nm no matter how much of a sulfhydryl-containing silane reagent is used.

Figure 3:
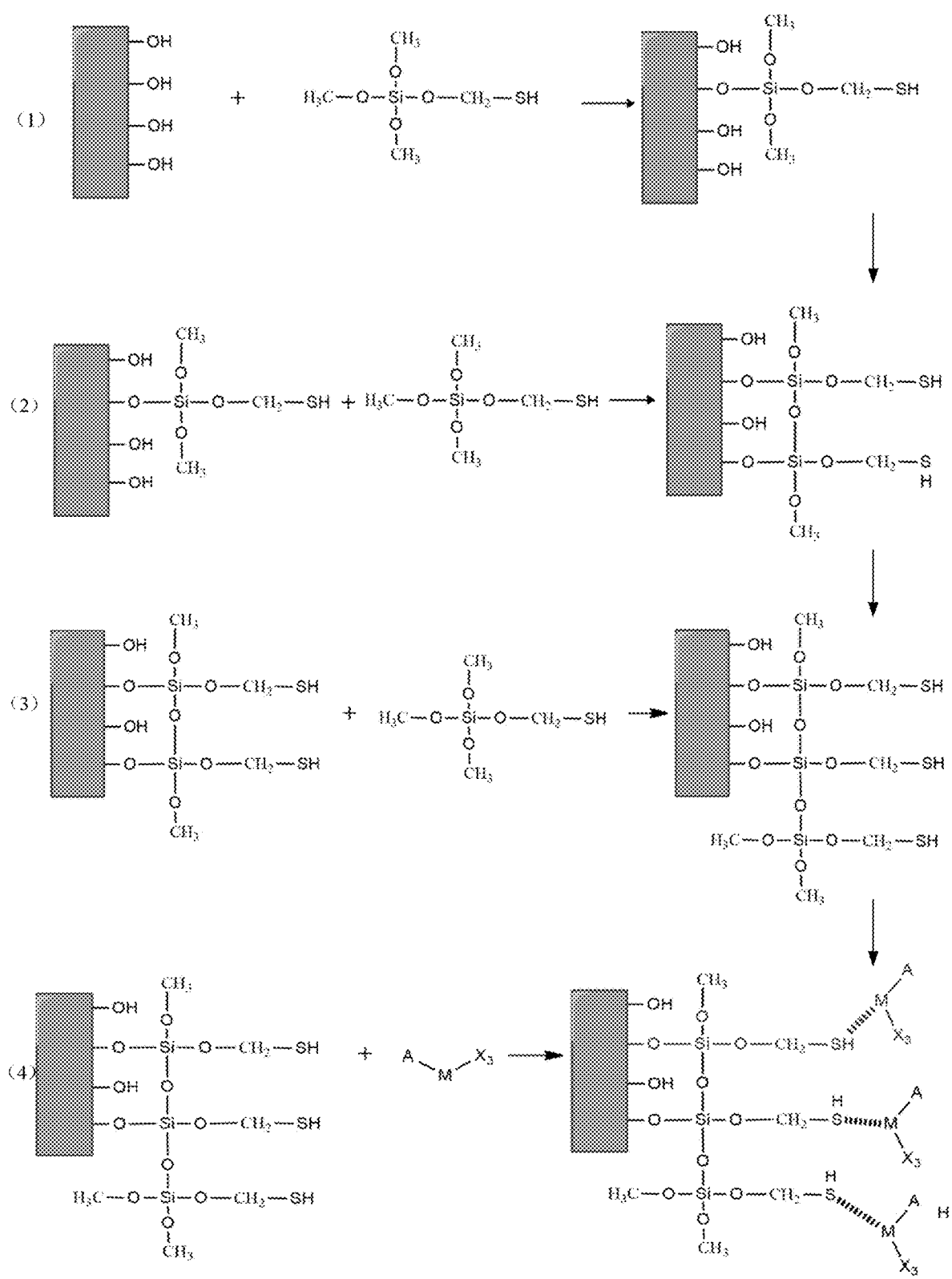
FIG. 3 is a reaction equation illustrating formation of an organically combined structure of a zinc oxide layer, a layer of sulfhydryl-containing siloxane polymer, and a perovskite quantum dot layer.

Specifically, FIG. 3 is a reaction equation illustrating the formation of an organically combined structure of a zinc oxide layer, a layer of sulfhydryl-containing siloxane polymer, and a perovskite quantum dot layer. As shown in FIG. 3, the electron blocking layer 7 is formed after the electron transport layer 4 is formed in the case where the quantum dot light emitting diode is an inverted light emitting diode. The zinc oxide layer serves as the electron transport layer 4, the layer of sulfhydryl-containing siloxane polymer serves as the electron blocking layer 7, and the perovskite quantum dot layer serves as the quantum dot layer 3. The zinc oxide layer may be formed by dissolving zinc acetate in a mixed solution of ethanolamine and n-butanol, coating the cathode layer 1 with the mixed solution and heating. In the zinc oxide layer such formed, the zinc oxide contains hydroxyl groups (—OH) in structure. As shown in FIG. 3, the zinc oxide layer is represented by a rectangular frame having hydroxyl groups attached thereto. In FIG. 3, as an example, the layer of sulfhydryl-containing siloxane polymer is made from a 3-mercaptopropyltrimethoxysilane reagent.

FIG. 3 shows the introduction of the 3-mercaptopropyltrimethoxysilane reagent into a surface of the zinc oxide layer. Reaction Equation (1) represents a hydrolytic process of the first 3-mercaptopropyltrimethoxysilane molecule on the surface of the zinc oxide layer. Reaction Equation (2) represents the processes that the second 3-mercaptopropyltrimethoxysilane molecule is hydrolyzed on the surface of the zinc oxide layer and simultaneously subjected to dehydration condensation with the first 3-mercaptopropyltrimethoxysilane molecule. Reaction Equation (3) represents the processes that the third 3-mercaptopropyltrimethoxysilane molecule is hydrolyzed on the surface of the zinc oxide layer and simultaneously subjected to dehydration condensation with the second 3-mercaptopropyltrimethoxysilane molecule. In this way, a sulfhydryl-containing siloxane monolayer can be formed on the surface of the zinc oxide layer by multiple hydrolytic processes of 3-mercaptopropyltrimethoxysilane molecules. Reaction Equation (4) represents a process of forming metal-sulfur bonds between sulfhydryl groups of the surface of the layer of sulfhydryl-containing siloxane polymer and the metal ions of the perovskite quantum layer.

At this time, the hydrolysis of the sulfhydryl-containing silane reagent on the surface of the zinc oxide layer is achieved with the aid of the hydroxyl groups of the surface of the zinc oxide layer, so as to introduce a monolayer containing a siloxane compound to the hydroxyl groups of the surface of the zinc oxide layer, that is, forming the electron blocking layer 7. The obtained electron blocking layer 7 can effectively cover the oxygen defective sites of the surface of the electron transport layer 4 made of zinc oxide; meanwhile, with the electron transport layer 4 covered by the electron blocking layer 7, the electron transport layer 4 can be prevented from absorbing water and oxygen, so that the damage to the quantum dot layer 3 can be reduced and the quantum dot layer 3 can function stably. In addition, since the sulfhydryl-containing siloxane polymer, which is used to form the electron blocking layer 7, can block the electrons from the electron transport layer 4 to a certain extent, the electron transport rate can be adjusted by adjusting the thickness of the layer of sulfhydryl-containing siloxane polymer, so as to realize a balance in carrier (electrons and holes) injection rate, thereby improving the performance of the quantum dot light emitting diode. Meanwhile, the sulfhydryl-containing siloxane polymer material of the electron blocking layer 7 chemically reacts with the divalent or monovalent metal ions (such as $Pb^{2+}$, $Sn^{2+}$, $Sb^{2+}$, and $Ag^+$) in the perovskite quantum dot layer 3 to form strong metal-sulfur bonds (Pb—S bonds, Sn—S bonds, Sb—S bonds, and Ag—S bonds), and the electron transport layer 4 and the perovskite quantum dot layer 3 are closely coupled through the metal-sulfur bonds to form an organically combined body.

In some implementations, the quantum dot light emitting diode is an inverted quantum dot light emitting diode which includes the substrate 10, and the cathode layer 1, the electron transport layer 4, the electron blocking layer 7, the quantum dot layer 3, and the anode layer 2 sequentially disposed in a direction away from the substrate 10. In some instances, the quantum dot light emitting diode further includes a hole transport layer 5 disposed between the anode layer 2 and the quantum dot layer 3, and a hole injection layer 6 disposed between the hole transport layer 5 and the anode layer 2.

The material of the anode layer 2 includes, but is not limited to, high-work-function metal materials (e.g. gold, copper, silver and platinum), inorganic metal oxides (e.g. indium tin oxide (ITO), and zinc oxide (ZnO)), and organic conductive polymers (e.g. poly(3,4-ethylenedioxythiophene) polystyrene sulfonate (PEDOT:PSS), and polyaniline (PANI)).

The material of the cathode layer 1 includes, but is not limited to, low-work-function metal materials such as lithium, magnesium, calcium, strontium, aluminum and indium or alloys of the above metals and copper, gold and silver; or, the cathode layer 1 may be made from a very thin insulating buffer layer (such as LiF and $CsCO_3$) and the above metals or alloys.

The material of the hole injection layer 6 includes, but is not limited to, poly(3,4-ethylenedioxythiophene) polystyrene sulfonate (PEDOT:PSS), polythiophene, polyaniline, polypyrrole, copper phthalocyanine, and 4,4',4"-tris(N,N-phenyl-3-methylphenylamino)triphenylamine (m-MTDATA), $MoO_3$, and CuPc.

The material of the hole transport layer 5 includes, but is not limited to, p-type polymer materials and various p-type low molecular weight materials, such as polythiophene, polyaniline, polypyrrole, a mixture of poly(3,4-ethylenedioxythiophene) and poly(sodium-p-styrenesulfonate), 4,4'-cyclohexylidenebis[N,N-bis(4-methylphenyl)aniline (TAPC), 4,4',4"-tris(N-carbazolyl)triphenylamine (TCTA), and N,N'-bis(1-naphthyl)-N,N'-diphenylbenzidine (NPB), or any combination thereof.

The material of the electron injection layer includes, but is not limited to, any one of lithium fluoride, sodium fluoride, potassium fluoride, rubidium fluoride, cesium fluoride, lithium oxide, and lithium metaborate.

In some implementations, as a support of the functional layers such as the electrode layers and the electron transport layer 4 in the light emitting device, the substrate 10 has good light transmittance in a visible light region and good surface smoothness, is capable of preventing permeation of moisture and oxygen to a certain extent, and is typically made from glass, a flexible substrate, an array substrate, or the like. If the substrate 10 is made from a flexible substrate, the flexible substrate may be made of polyester or polyimide, or formed by a relatively thin metal plate.

An embodiment of the present disclosure further provides a manufacturing method of a quantum dot light emitting diode, which can be used for manufacturing the above quantum dot light emitting diode. The method includes the steps of forming an anode layer 2, a cathode layer 1, a quantum dot layer 3 between the anode layer 2 and the cathode layer 1, and an electron transport layer 4 between the quantum dot layer 3 and the cathode layer 1, and further includes a step of forming an electron blocking layer 7 between the electron transport layer 4 and the quantum dot layer 3. Metal-sulfur bonds 8 are formed in an interface between the electron blocking layer 7 and the quantum dot layer 3, and contain metal elements from the quantum dot layer 3 and sulfur elements from the electron blocking layer 7.

In the embodiment of the present disclosure, the manufacturing method of the quantum dot light emitting diode includes the step of forming the electron blocking layer 7. The electron blocking layer 7 can reduce the electron transport rate to avoid the problem that the device performance is affected by the excessive accumulation of electrons in the quantum dot layer caused by the unbalanced carrier injection occurring because an electron transport rate is usually greater than a hole transport rate. Meanwhile, the metal-sulfur bonds 8, which contain the metal elements from the quantum dot layer 3 and the sulfur elements from the electron blocking layer 7, are formed in the interface between the electron blocking layer 7 and the quantum dot layer 3, in this way, the interface between the electron blocking layer 7 and the quantum dot layer 3 forms an organically combined body through the metal-sulfur bonds 8 to achieve close coupling between the electron transport layer 4 and the quantum dot layer 3, which prevents the electron transport layer 4 from adsorbing water and oxygen, thereby reducing the damage to a material of the quantum dot layer 3.

Figure 4:
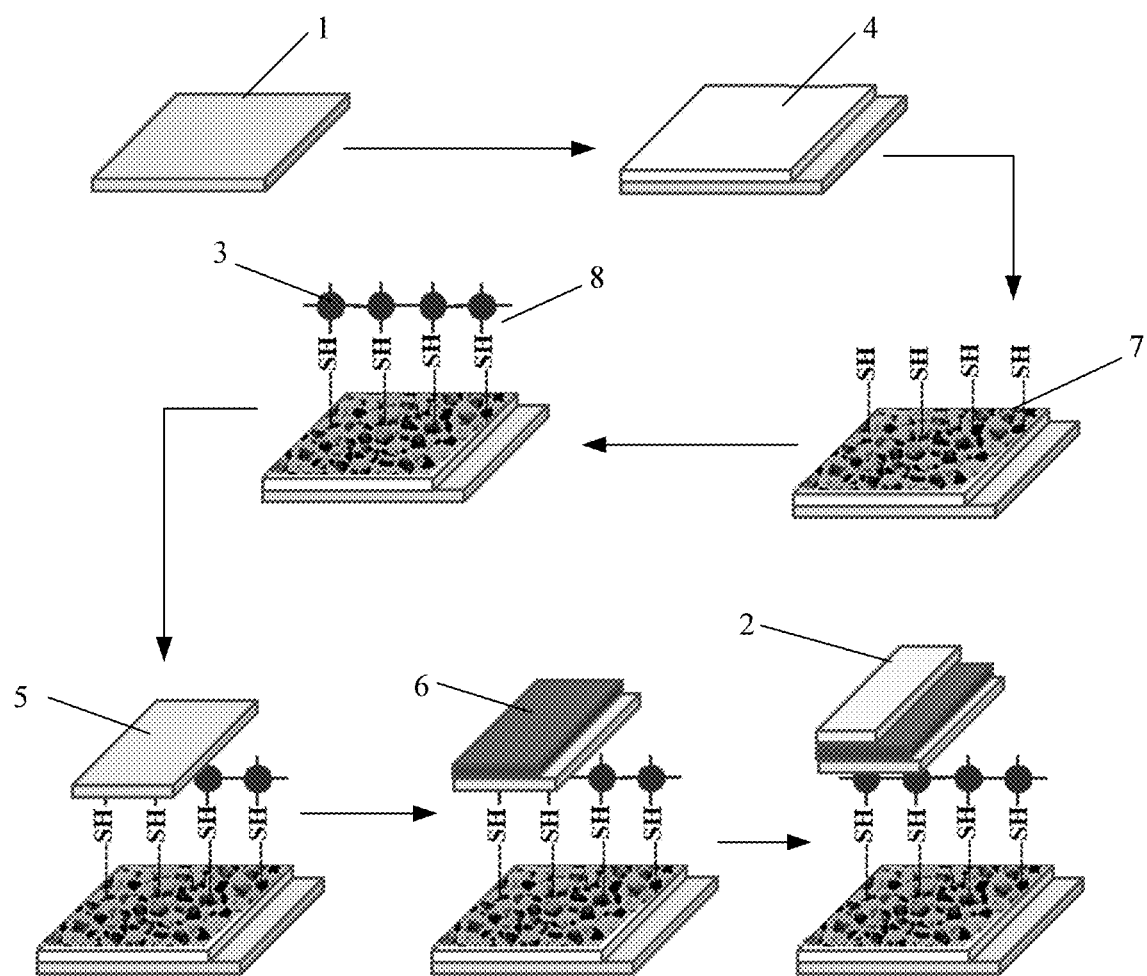
FIG. 4 is a flowchart illustrating a manufacturing process of a quantum dot light emitting diode according to an embodiment of the present disclosure.

In order to make the manufacturing method of the quantum dot light emitting diode in the embodiment of the present disclosure clearer, the manufacturing method is described by taking an example that the quantum dot light emitting diode is an inverted light emitting diode and the quantum dot layer in the quantum dot light emitting diode is made of perovskite quantum dots. FIG. 4 is a flowchart illustrating a manufacturing process of a quantum dot light emitting diode according to the embodiment of the present disclosure. As shown in FIG. 4, the manufacturing method of the quantum dot light emitting diode includes the following steps S1 to S8 according to the embodiment of the present disclosure.

In the step S1, a substrate 10 is provided and the cathode layer 1 of the quantum dot light emitting diode is formed on the substrate 10.

Specifically, the step S1 may include forming a conductive metal layer, such as an ITO thin film or a fluorine-doped tin oxide (FTO) thin film, on the substrate 10, forming a pattern including the cathode layer 1 of the quantum dot light emitting diode by a patterning process, performing ultrasonic cleaning with water and isopropanol separately, and performing ultraviolet (UV) light treatment for about 5 min to 10 min.

Both the material of the substrate 10 and the material of the cathode layer 1 can be selected from the materials described in the above embodiment of the quantum dot light emitting diode, and those materials will not be listed here.

In the step S2, the electron transport layer 4 is formed on the substrate 10 subjected to the step S1.

The electron transport layer 4 may be a zinc oxide-based nanoparticle thin film or a zinc oxide thin film, or may be made of any one of the materials of the electron transport layer 4 described in the above embodiment of the quantum dot light emitting diode.

When the electron transport layer 4 is a zinc oxide-based nanoparticle thin film, the step of preparing the zinc oxide nanoparticle thin film may include spin-coating zinc oxide nanoparticles, and heating at a temperature ranging from 80° C. to 120° C. to form a film. The material of the electron transport layer 4 may be ion-doped zinc oxide nanoparticles, such as magnesium oxide nanoparticles doped with Mg, In, Al, and Ga. The rotation speed of the spin coater is set to 500 rpm to 2500 rpm to adjust the thickness of the film.

When the electron transport layer 4 is a zinc oxide thin film, the step of preparing the zinc oxide thin film may include dissolving 2 g of zinc acetate (or zinc nitrate and the like) in 10 ml of a mixed solution of ethanolamine and n-butanol, placing the substrate 10 subjected to the step S1 on a spin coater, dripping 90 μl to 120 μl of a precursor solution of zinc to the cathode layer 1, spin coating, and heating the substrate 10 formed with the cathode layer 1 thereon on a heating stage at a temperature ranging from 250° C. to 300° C. to volatilize the solvent, so as to finally form the zinc oxide film on the cathode layer 1.

In the step S3, the electron blocking layer 7 is formed on the substrate 10 subjected to the step S2.

In the example that the electron blocking layer 7 is a thin film of sulfhydryl-containing siloxane polymer, the step S3 may include coating the substrate 10 subjected to the step S2 with a layer of a sulfhydryl-containing silane reagent. Specifically, the step may include dissolving a modifier of silane containing sulfhydryl groups in a nonpolar solution, and dripping the nonpolar solution of the modifier of silane containing sulfhydryl groups to a surface of the electron transport layer 4 to form a thin film of sulfhydryl-containing siloxane polymer used as the electron blocking layer 7. Alternatively, the step may include immersing the substrate 10 formed with the electron transport layer 4 thereon in a nonpolar solution of a sulfhydryl-containing silane for a certain time to form a thin film of sulfhydryl-containing siloxane polymer used as the electron blocking layer 7. The nonpolar solution includes, but is not limited to, a toluene solution or a tetrahydrofuran solution.

The sulfhydryl-containing silane reagent in the above step may be selected from 3-mercaptopropyltrimethoxysilane, 3-mercaptopropyltriethoxysilane, 3-mercaptopropylmethyldimethoxysilane, 3-mercaptopropylmethyldiethoxysilane, mercaptopropylsilane, 3-mercaptopropyltrimethylsilane, bis-[3-(triethoxysilyl)propyl]-tetrasulfide, or the like.

In the step S4, the quantum dot layer 3 is formed on the substrate 10 subjected to the step S3.

In the example that the quantum dot layer 3 is a perovskite quantum dot layer, the step of forming the perovskite quantum dot layer 3 includes spin coating perovskite quantum dots on the substrate 10 formed with the electron blocking layer 7 thereon. Specifically, a low-boiling-point solution (chloroform, toluene, n-hexane, n-octane, n-heptane, etc.) of perovskite quantum dots is spin-coated on the substrate 10 subjected to the step S3, and a drying process is performed at a temperature ranging from 80° C. to 120° C. to form a film, that is, forming the quantum dot layer 3.

In the embodiment of the present disclosure, the material of the quantum dot layer 3 includes, but is not limited to, various perovskite quantum dots, which specifically include: (1) lead-containing perovskite quantum dots, such as organic-inorganic lead halide $MAPbX_3$ quantum dots, all-inorganic cesium lead halide $CsPbX_3$ quantum dots, and rare earth ion (lanthanum, samarium, uranium, etc.)-doped $MAPbX_3$ or $CsPbX_3$ quantum dots, MA being $CH_3NH_3$, and X being any one of Cl, Br and I; and (2) at least one of bismuth-based perovskite quantum dots, tin-based perovskite quantum dots, and silver-based perovskite quantum dots, such as $CsSnX_3$ quantum dots, $CsSbX_3$ quantum dots, $Cs_2SnX_6$ quantum dots, $Cs_2AgInCl_6$ quantum dots, $CH_3NH_3SbX_3$ quantum dots, and $CH_3NH_3SnX_3$ quantum dots, X being any one of Cl, Br and I. The material of the quantum dot layer 3 may also be any one of the materials of the quantum dot layer 3 described in the above embodiment of the quantum dot light emitting diode, and those materials will not be listed here.

In the step S5, the hole transport layer 5 is formed on the substrate 10 subjected to the step S4.

The hole transport layer 5 may be formed on the substrate 10 formed with the quantum dot layer 3 thereon by means of spin coating or evaporation in the step S5.

The material of the hole transport layer 5 may be selected from organic substances, and includes, but is not limited to, poly(9,9-dioctylfluorene-co-N-(4-butylphenyl)diphenylamine) (TFB), polyvinylcarbazole (PVK), or other commercial compounds suitable for the hole transport layer 5. When TFB is selected as the material of the hole transport layer 5, a film-forming condition may be in an inert gas at a temperature ranging from 130° C. to 150° C., and a thickness of a film can be adjusted and controlled according to a rotation speed of a spin coater. The material of the hole transport layer 5 may also be any one of the materials of the hole transport layer 5 described in the above embodiment of the quantum dot light emitting diode, and those materials will not be listed here.

In the step S6, the hole injection layer 6 is formed on the substrate 10 subjected to the step S5.

The hole injection layer 6 may be formed on the substrate 10 formed with the hole transport layer 5 thereon by means of spin coating or evaporation in the step S6.

The material of the hole injection layer 6 may be selected from organic substances, and includes, but is not limited to, PEDOT:PSS 4083 (poly(3,4-ethylenedioxythiophene) polystyrene sulfonate) or other commercial compounds suitable for the hole injection layer 6. When PEDOT is selected as the material of the hole injection layer 6, a film-forming condition may be in the air at a temperature ranging from 130° C. to 150° C., and a thickness of a film can be adjusted and controlled according to a rotation speed of a spin coater. The material of the hole injection layer 6 may also be any one of the materials of the hole injection layer 6 described in the above embodiment of the quantum dot light emitting diode, and those materials will not be listed here.

In the step S7, the anode layer 2 is formed on the substrate 10 subjected to the step S6.

In the step S7, the anode layer 2 may be prepared by a method which includes, but is not limited to, forming an aluminum film or a silver film by evaporation, or forming an indium zinc oxide (IZO) film by sputtering, so as to form the quantum dot light emitting diode. The material of the anode layer 2 may also be any one of the materials of the anode layer 2 described in the above embodiment of the quantum dot light emitting diode, and those materials will not be listed here.

In the step S8, the substrate 10 subjected to the step S7 is packaged to complete the preparation of the quantum dot light emitting diode.

In the step S8, a cover plate may be disposed on the substrate 10 formed with the anode layer 2 thereon, and a UV-curable adhesive is used for packaging the device, thereby completing the preparation of the quantum dot light emitting diode.

An embodiment of the present disclosure further provides a display device, including the above quantum dot light emitting diode. The display device provided by the embodiment of the present disclosure has high luminous efficiency and long service life.

The display device may be any product or component with a display function, such as electronic paper, an OLED panel, a QLED panel, a mobile phone, a tablet computer, a television, a monitor, a notebook computer, a digital photo frame, and a navigator.

It should be understood that the above embodiments are merely exemplary embodiments adopted to illustrate the principles of the present application, and the present application is not limited thereto. Without departing from the spirit and essence of the present application, those skilled in the art may make various modifications and improvements to the present application, which should be considered to fall within the scope of the present application.

What is claimed is:

1. A quantum dot light emitting diode, comprising an anode layer, a cathode layer, a quantum dot light emitting layer disposed between the anode layer and the cathode layer, and an electron transport layer disposed between the quantum dot light emitting layer and the cathode layer, wherein, the quantum dot light emitting diode further comprises an electron blocking layer disposed between the electron transport layer and the quantum dot light emitting layer, the electron blocking layer and the electron transport layer are coupled through siloxane bonds, the electron blocking layer and the quantum dot light emitting layer are coupled through metal-sulfur bonds, and the metal sulfur bonds contain metal elements from the quantum dot light emitting layer and sulfur elements from the electron blocking layer.

2. The quantum dot light emitting diode of claim 1, wherein the electron blocking layer is made of a sulfhydryl-containing siloxane polymer.

3. The quantum dot light emitting diode of claim 2, wherein the sulfhydryl-containing siloxane polymer comprises any one of 3-mercaptopropyltrimethoxysilane, 3-mercaptopropyltriethoxysilane, 3-mercaptopropylmethyldimethoxysilane, 3-mercaptopropylmethyldiethoxysilane, mercaptopropylsilane, 3-mercaptopropyltrimethylsilane, and bis[3-(triethoxysilyl)propyl]-tetrasulfide.

4. The quantum dot light emitting diode of claim 2, wherein an alkyl group in the sulfhydryl-containing siloxane polymer comprises any one of methyl, ethyl, propyl, hexyl, nonyl, dodecyl, tetradecyl, hexadecyl, octadecyl, and phenyl.

5. The quantum dot light emitting diode of claim 1, wherein a material of the quantum dot light emitting layer comprises organic-inorganic hybrid perovskite quantum dots or all-inorganic perovskite quantum dots.

6. The quantum dot light emitting diode of claim 5, wherein the organic-inorganic hybrid perovskite quantum dots are MABX, MA is $CH_3NH_3$, B is any one of Pb, Sn, Sb and Ag, and X is any one of Cl, Br and I; and the all-inorganic perovskite quantum dots are ABX, A is Cs, B is any one of Pb, Sn, Sb and Ag, and X is any one of Cl, Br and I.

7. The quantum dot light emitting diode of claim 1, wherein a material of the electron transport layer comprises at least one of zinc oxide, magnesium zinc oxide, aluminum zinc oxide, and magnesium aluminum zinc oxide, or comprises at least one of ion-doped zinc oxide, ion-doped magnesium zinc oxide, ion-doped aluminum zinc oxide, and ion-doped magnesium aluminum zinc oxide.

8. The quantum dot light emitting diode of claim 1, further comprising a substrate, a hole transport layer, and a hole injection layer, wherein the cathode layer, the electron transport layer, the electron blocking layer, the quantum dot light emitting layer, the hole transport layer, the hole injection layer, and the anode layer are sequentially disposed in a direction away from the substrate.

9. The quantum dot light emitting diode of claim 2, further comprising a substrate, a hole transport layer, and a hole injection layer, wherein the cathode layer, the electron transport layer, the electron blocking layer, the quantum dot light emitting layer, the hole transport layer, the hole injection layer, and the anode layer are sequentially disposed in a direction away from the substrate.

10. The quantum dot light emitting diode of claim 5, further comprising a substrate, a hole transport layer, and a hole injection layer, wherein the cathode layer, the electron transport layer, the electron blocking layer, the quantum dot light emitting layer, the hole transport layer, the hole injection layer, and the anode layer are sequentially disposed in a direction away from the substrate.

11. The quantum dot light emitting diode of claim 1, wherein the electron blocking layer has a thickness of about 0.685 nm.

12. The quantum dot light emitting diode of claim 2, wherein the electron blocking layer has a thickness of about 0.685 nm.

13. The quantum dot light emitting diode of claim 5, wherein the electron blocking layer has a thickness of about 0.685 nm.

14. The quantum dot light emitting diode of claim 1, further comprising a hole transport layer disposed between the anode layer and the quantum dot light emitting layer, and a hole injection layer disposed between the hole transport layer and the anode layer.

15. The quantum dot light emitting diode of claim 2, further comprising a hole transport layer disposed between the anode layer and the quantum dot light emitting layer, and a hole injection layer disposed between the hole transport layer and the anode layer.

16. The quantum dot light emitting diode of claim 5, further comprising a hole transport layer disposed between the anode layer and the quantum dot light emitting layer, and a hole injection layer disposed between the hole transport layer and the anode layer.

17. A manufacturing method of a quantum dot light emitting diode, comprising steps of forming an anode layer, a cathode layer, a quantum dot light emitting layer between the anode layer and the cathode layer, and an electron transport layer between the quantum dot light emitting layer and the cathode layer, wherein the manufacturing method further comprises:

a step of forming an electron blocking layer between the electron transport layer and the quantum dot light emitting layer, the electron blocking layer and the electron transport layer are coupled through siloxane bonds, the electron blocking layer and the quantum dot light emitting layer are coupled through metal-sulfur bonds, and the metal-sulfur bonds contain metal elements from the quantum dot light emitting layer and sulfur elements from the electron blocking layer.

18. The manufacturing method of claim 17, wherein the electron blocking layer is formed of a sulfhydryl-containing siloxane polymer, and the step of forming the electron blocking layer comprises:

dissolving a sulfhydryl-containing silane reagent in a nonpolar solution, and dripping the nonpolar solution of the sulfhydryl-containing silane reagent to a side of the electron transport layer away from the cathode layer, so as to form the electron blocking layer; or immersing the substrate formed with the electron transport layer thereon in a nonpolar solution of a sulfhydryl-containing silane reagent, so as to form the electron blocking layer.

19. The manufacturing method of claim 18, wherein the sulfhydryl-containing siloxane polymer comprises any one of 3-mercaptopropyltrimethoxysilane, 3-mercaptopropyltriethoxysilane, 3-mercaptopropylmethyldimethoxysilane, 3-mercaptopropylmethyldiethoxysilane, mercaptopropyl silane, 3-mercaptopropyltrimethylsilane, and bis[3-(triethoxysilyl)propyl]-tetrasulfide.

20. A display device, comprising a quantum dot light emitting diode of claim 1.

* * * * *